(12) United States Patent
Shimizu et al.

(10) Patent No.: US 11,011,369 B2
(45) Date of Patent: May 18, 2021

(54) CARBON FILM FORMING METHOD, CARBON FILM FORMING APPARATUS, AND STORAGE MEDIUM

(71) Applicant: TOKYO ELECTRON LIMITED, Tokyo (JP)

(72) Inventors: Akira Shimizu, Nirasaki (JP); Masayuki Kitamura, Nirasaki (JP); Yosuke Watanabe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 17 days.

(21) Appl. No.: 15/601,245

(22) Filed: May 22, 2017

(65) Prior Publication Data
US 2017/0345644 A1 Nov. 30, 2017

(30) Foreign Application Priority Data
May 24, 2016 (JP) .............................. JP2016-103493

(51) Int. Cl.
*H01L 21/02* (2006.01)
*H01L 21/67* (2006.01)
(Continued)

(52) U.S. Cl.
CPC .... *H01L 21/02115* (2013.01); *C23C 16/0272* (2013.01); *C23C 16/26* (2013.01); *C23C 16/46* (2013.01); *C23C 16/52* (2013.01); *H01L 21/02205* (2013.01); *H01L 21/02211* (2013.01); *H01L 21/02271* (2013.01); *H01L 21/02304* (2013.01); *H01L 21/67098* (2013.01); *H01L 21/67109* (2013.01)

(58) Field of Classification Search
CPC ......... H01L 21/02115; H01L 21/02271; H01L 21/67098; C23C 16/26
See application file for complete search history.

(56) References Cited

U.S. PATENT DOCUMENTS

| 2014/0011368 A1* | 1/2014 | Obu .................. H01L 21/02304 438/763 |
| 2014/0264282 A1* | 9/2014 | Lee ........................ H01L 29/267 257/29 |
| 2017/0207087 A1* | 7/2017 | Roy .................. H01L 21/02175 |

FOREIGN PATENT DOCUMENTS

| JP | 8-208207 A | 8/1996 |
| JP | 2002-12972 A | 1/2002 |

(Continued)

*Primary Examiner* — Eduardo A Rodela
*Assistant Examiner* — Christopher M Roland
(74) *Attorney, Agent, or Firm* — Nath, Goldberg & Meyer; Jerald L. Meyer

(57) ABSTRACT

There is provided a method of forming a carbon film on a workpiece, which includes: loading the workpiece into a process chamber; supplying a gas containing a boron-containing gas into the process chamber to form a seed layer composed of a boron-based thin film on a surface of the workpiece; and subsequently, supplying a hydrocarbon-based carbon source gas and a pyrolysis temperature lowering gas containing a halogen element and which lowers a pyrolysis temperature of the hydrocarbon-based carbon source gas into the process chamber, heating the hydrocarbon-based carbon source gas to a temperature lower than the pyrolysis temperature to pyrolyze the hydrocarbon-based carbon source gas, and forming the carbon film on the workpiece by a thermal CVD.

7 Claims, 5 Drawing Sheets

(51) Int. Cl.
*C23C 16/02* (2006.01)
*C23C 16/26* (2006.01)
*C23C 16/46* (2006.01)
*C23C 16/52* (2006.01)

(56) References Cited

FOREIGN PATENT DOCUMENTS

| | | |
|---|---|---|
| JP | 2012-17502 A | 1/2012 |
| JP | 2014-33186 A | 2/2014 |
| KR | 10-2014-0114199 A | 9/2014 |

* cited by examiner

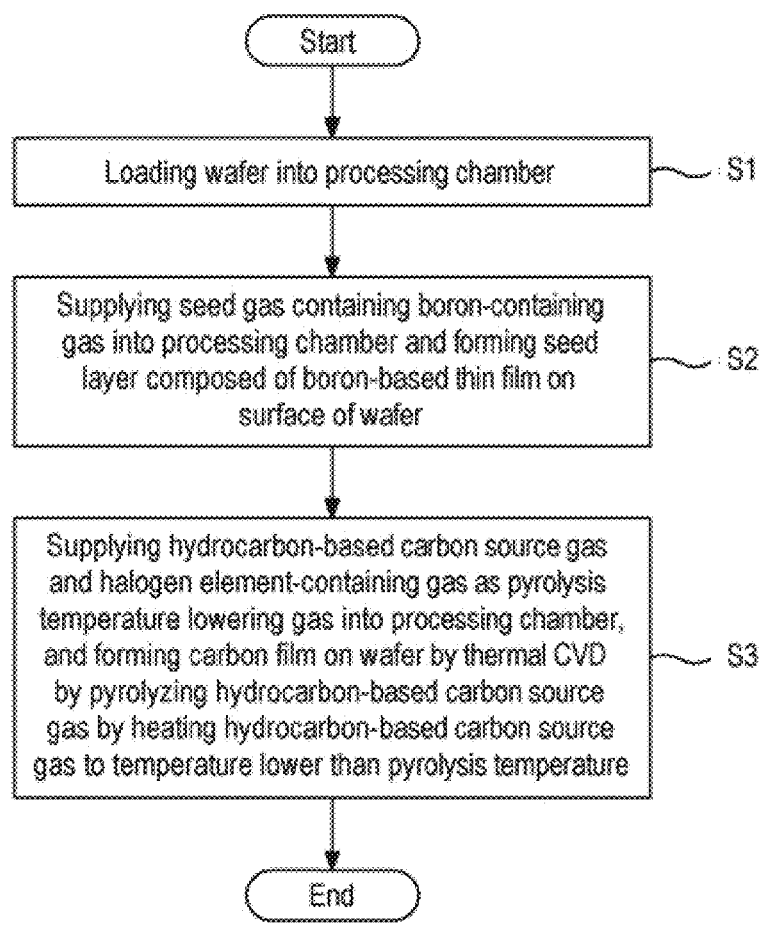

FIG. 5

| Seed layer | Film type | Sample A | Sample B | Sample C | Sample D |
|---|---|---|---|---|---|
| | | BN film (300°C) | | | |
| | Time | 2.5min | | | |
| | Assumed film thickness | <1nm | | | |
| Base film type | | Th-Ox | a-Si | BSiLT | SiN |
| Tape test results | | OK | OK | OK | OK |
| Tape test photographs | | | | | |
| SEM | | 200nm | 200nm | 200nm | 200nm |

CARBON FILM FORMING METHOD, CARBON FILM FORMING APPARATUS, AND STORAGE MEDIUM

CROSS-REFERENCE TO RELATED APPLICATION

This application claims the benefit of Japanese Patent Application No. 2016-103493, filed on May 24, 2016, in the Japan Patent Office, the disclosure of which is incorporated herein in its entirety by reference.

TECHNICAL FIELD

The present disclosure relates to a carbon film forming method, a carbon film forming apparatus, and a non-transitory computer-readable storage medium.

BACKGROUND

Carbon (C) is getting a lot of attentions as one of the materials used in patterning processing of next-generation semiconductor devices. In such a patterning process, a good buriability for a stepped shape is required.

As a film forming method which obtains such a good buriability for a stepped shape, a coating method has been studied but there is a problem in heat resistance.

Meanwhile, a plasma CVD method or a thermal CVD method has been generally known as a method of forming a carbon film.

However, in the case of forming a carbon film using the plasma CVD method, a film formation temperature may be kept at a low level (in a range of 100 to 500 degrees C. in the related art), but step coverage is poor. As such, the plasma CVD method may not be suitable for forming a carbon film on an underlying film having irregularities such as a line pattern, a hole pattern or the like.

In addition, in the case of forming a carbon film using the thermal CVD method, a step coverage is relatively good, but a film formation temperature needs to be kept at a high level (in a range of 800 to 1,000 degrees C. in the related art). Even if film formation conditions are optimized, there is a limit that the film formation temperature falls within a range of 600 to 800 degrees C. For example, in view of a thermal history with respect to a transistor formed on a silicon wafer, the thermal CVD method may not be suitable for use in a process applied to an upper layer portion of a semiconductor device.

In this regard, there is proposed a technique which uses a pyrolysis temperature lowering gas that lowers a pyrolysis temperature of a hydrocarbon-based carbon source gas used as a film-forming raw material, when forming a carbon film by a thermal CVD method which provides a relatively good step coverage. Specifically, such a technique is to reduce a film formation temperature using a halogen-containing gas such as a $Cl_2$ gas as the pyrolysis temperature lowering gas, thus lowering the pyrolysis temperature. In addition, this technique involves forming a seed layer for improving adhesion by supplying an aminosilane-based gas onto an underlying film before forming a carbon film.

However, in the conventional technique which uses the pyrolysis temperature lowering gas such as a $Cl_2$ gas or the like to perform the film formation at a low temperature, it has been found that, for example, when a silicon film is used as the underlying film, even if the seed layer is formed by the aminosilane-based gas, the adhesion may deteriorate to such an extent that film peeling occurs at a film thickness of about 10 nm.

SUMMARY

Some embodiments of the present disclosure provide a carbon film forming method and a carbon film forming apparatus, which are capable of forming a carbon film having good adhesion, in a case where a pyrolysis temperature lowering gas is used to perform film formation at a low temperature, and a non-transitory computer-readable storage medium.

According to one embodiment of the present disclosure, there is provided a method of forming a carbon film on a workpiece, which includes: loading the workpiece into a process chamber; supplying a gas containing a boron-containing gas into the process chamber to form a seed layer composed of a boron-based thin film on a surface of the workpiece; and subsequently, supplying a hydrocarbon-based carbon source gas and a pyrolysis temperature lowering gas containing a halogen element and which lowers a pyrolysis temperature of the hydrocarbon-based carbon source gas into the process chamber, heating the hydrocarbon-based carbon source gas to a temperature lower than the pyrolysis temperature to pyrolyze the hydrocarbon-based carbon source gas, and forming the carbon film on the workpiece by a thermal CVD.

According to another embodiment of the present disclosure, there is provided an apparatus of forming a carbon film on a workpiece, which includes: a process chamber in which the workpiece on which the carbon film is to be formed is accommodated; a process gas supply mechanism configured to supply a gas to be used for process into the process chamber; a heating device configured to heat the workpiece accommodated in the process chamber; a loading mechanism configured to load the workpiece into the process chamber, and a control part configured to control the process gas supply mechanism, the heating device and the loading mechanism to perform the aforementioned method.

According to yet another embodiment of the present disclosure, there is provided a non-transitory computer-readable storage medium storing a program that operates on a computer for controlling a carbon film forming apparatus, wherein the program, when executed, causes the computer to control the carbon film forming apparatus so as to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flowchart showing a flow of a carbon film forming method according to one embodiment of the present disclosure.

FIG. 5 is a view showing results and relevant SEM photographs of tape test of samples A to D in an experimental example.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present inventors conducted research over and over to solve the aforementioned problems and, consequently, found the following facts. The use of boron or boron nitride as a seed layer makes it possible to suppress the reaction between a pyrolysis temperature lowering gas such as a $Cl_2$ gas and an underlying layer, thereby preventing deterioration of adhesion to the underlying layer.

Example of Apparatus for Carrying Out the Present Disclosure

Figure 1:
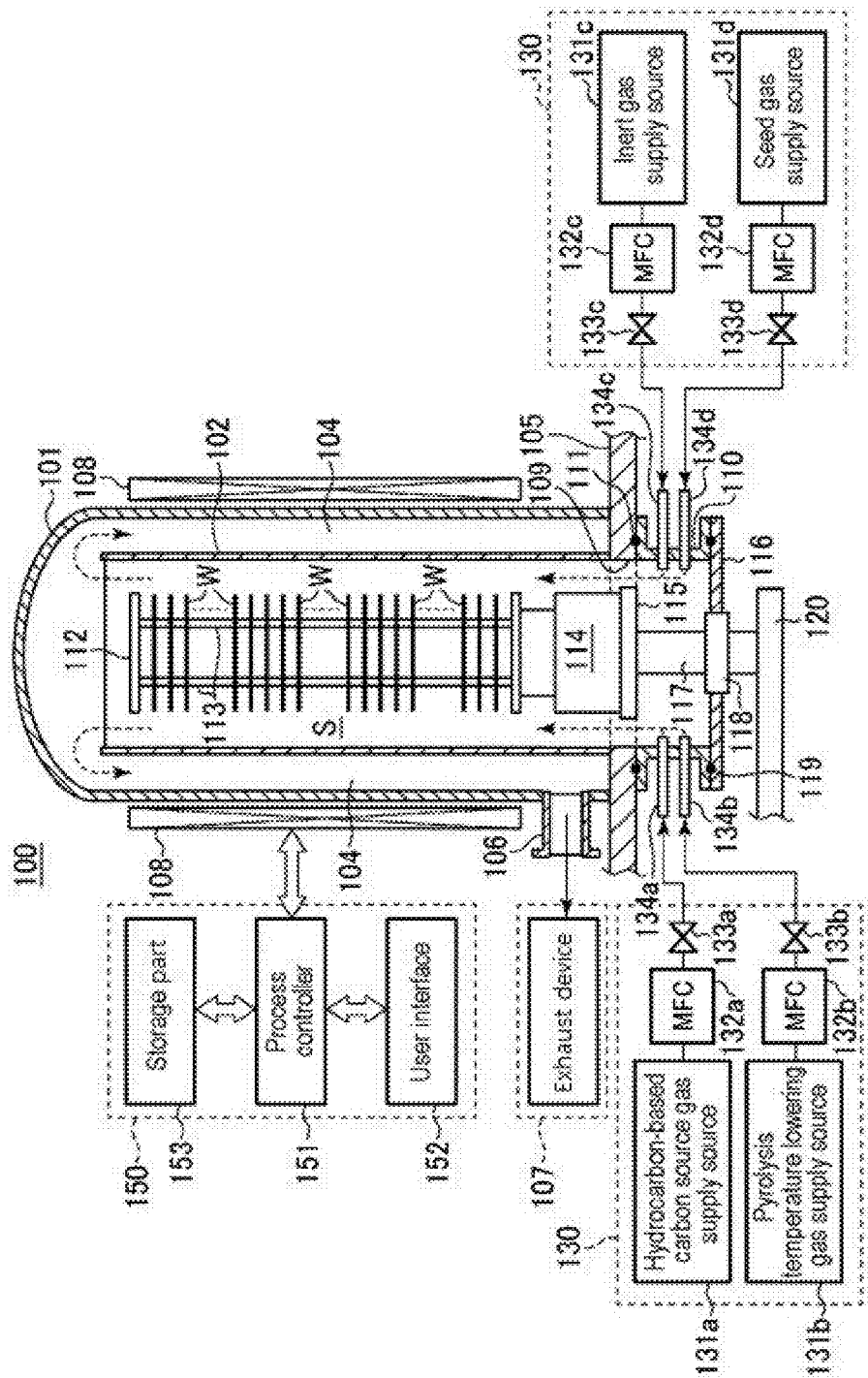
FIG. 1 is a sectional view schematically showing an example of a film forming apparatus capable of carrying out a film forming method of the present disclosure.

FIG. 1 is a sectional view schematically showing an example of a film forming apparatus capable of carrying out a film forming method of the present disclosure.

As shown in FIG. 1, a film forming apparatus 100 is configured as a vertical batch type film forming apparatus and includes a cylindrical outer wall 101 with a ceiling portion and a cylindrical inner wall 102 installed inside the outer wall 101. The outer wall 101 and the inner wall 102 are made of, e.g., quartz. An inner region of the inner wall 102 serves as a process chamber S in which a plurality of semiconductor wafers (hereinafter simply referred to as "wafers") W as workpieces is collectively processed.

The outer wall 101 and the inner wall 102 are spaced apart from each other along a horizontal direction with an annular space 104 formed therebetween and are joined to a base member 105 at their respective lower end portions. An upper end portion of the inner wall 102 is spaced apart from the ceiling portion of the outer wall 101 such that the upper portion of the process chamber S communicates with the annular space 104. The annular space 104 communicating with the upper portion of the process chamber S serves as an exhaust path. A gas supplied and diffused into the process chamber S flows from the lower portion of the process chamber S to the upper portion thereof and is sucked into the annular space 104. An exhaust pipe 106 is connected to the lower end portion of the annular space 104 and is also connected to an exhaust device 107. The exhaust device 107 includes a vacuum pump and the like, exhausts the process chamber S, and adjusts an internal pressure of the process chamber S to a pressure suitable for processing.

A heating device 108 is installed outside the outer wall 101 so as to surround the process chamber S. The heating device 108 adjusts an internal temperature of the process chamber S to a temperature suitable for processing and heats the plurality of wafers W at a time.

The lower portion of the process chamber S is in communication with an opening 109 formed in the base member 105. A cylindrical manifold 110 made of a material such as stainless steel is coupled to the opening 109 via a seal member 111 such as an O-ring. A lower end portion of the manifold 110 is opened such that a boat 112 is inserted into the process chamber S through such an opening. The boat 112 is made of, e.g., quartz and includes a plurality of columns 113. In the columns 113 are formed grooves (not shown) by which a plurality of target substrates is supported at a time. As a result, the boat 112 can mount the plurality of, e.g., 50 to 150, wafers W as the target substrates, in multiple stages. The boat 112 with the plurality of wafers W mounted thereon is loaded into the process chamber S, so that the plurality of wafers W can be accommodated in the process chamber S.

The boat 112 is placed on a table 115 via a quartz heat-insulating tube 114. The table 115 is supported on a rotary shaft 117 penetrating a lid part 116 made of, e.g., stainless steel. The lid part 116 opens and closes the opening of the lower end portion of the manifold 110. For example, a magnetic fluid seal 118 is installed in a penetration portion of the lid part 116 to rotatably support the rotary shaft 117 while hermetically sealing the rotary shaft 117. In addition, a seal member 119 such as an O-ring is interposed between a peripheral portion of the lid part 116 and the lower end portion of the manifold 110 to maintain the scalability of the process chamber S. The rotary shaft 117 is attached to the tip of an arm 120 supported by an elevating mechanism (not shown) such as a boat elevator. As a result, the wafer boat 112, the lid part 116 and so on are integrally moved up and down in the vertical direction, and are inserted into or detached from the process chamber S.

The film forming apparatus 100 includes a processing gas supply mechanism 130 configured to supply a gas used for process into the process chamber S.

The processing gas supply mechanism 130 of this example includes a hydrocarbon-based carbon source gas supply source 131a, a pyrolysis temperature lowering gas supply source 131b, an inert gas supply source 131c and a seed gas supply source 131d.

The hydrocarbon-based carbon source gas supply source 131a is coupled to a gas supply port 134a via a mass flow controller (MFC) 132a and an opening/closing valve 133a. Similarly, the pyrolysis temperature lowering gas supply source 131b is coupled to a gas supply port 134b via a mass flow controller (MFC) 132b and an opening/closing valve 133b. The inert gas supply source 131c is coupled to a gas supply port 134c via a mass flow controller (MFC) 132c and an opening/closing valve 133c. The seed gas supply source 131d is coupled to a gas supply port 134d via a mass flow controller (MFC) 132d and an opening/closing valve 133d. The gas supply ports 134a to 134d are respectively installed so as to horizontally penetrate a side wall of the manifold 110 and diffuse gases supplied thereto toward the interior of the process chamber S defined above the manifold 110.

A hydrocarbon-based carbon source gas supplied from the hydrocarbon-based carbon source gas supply source 131a is a gas used to form a carbon film by a thermal CVD method.

The hydrocarbon-based carbon source gas may be a gas containing hydrocarbon represented by at least one of molecular formulae of $C_nH_{2n+2}$, $C_mH_{2m}$ and $C_mH_{2m-2}$ (where, n is the natural number of one or more and m is the natural number of two or more).

In addition, the hydrocarbon-based carbon source gas may include a benzene gas ($C_6H_6$).

The hydrocarbon represented by the molecular formula of $C_nH_{2n+2}$ may include a methane gas ($CH_4$), an ethane gas ($C_2H_6$), a propane gas ($C_3H_8$), a butane gas ($C_4H_{10}$: also containing other isomer), a pentane gas ($C_5H_{12}$: also containing other isomer) or the like.

The hydrocarbon represented by the molecular formula of $C_mH_{2m}$ may include an ethylene gas ($C_2H_4$), a propylene gas ($C_3H_6$: also containing other isomer), a butylene gas ($C_4H_8$: also containing other isomer), a pentene gas ($C_5H_{10}$: also containing other isomer) or the like.

The hydrocarbon represented by the molecular formula of $C_mH_{2m-2}$ may include an acetylene gas ($C_2H_2$), a propyne gas ($C_3H_4$: also containing other isomer), a butadiene gas ($C_4H_6$: also containing other isomer), an isoprene gas ($C_5H_8$: also containing other isomer) or the like.

A gas containing a halogen element is used as the pyrolysis temperature lowering gas supplied from the pyrolysis temperature lowering gas supply source 131b. The gas containing a halogen element has a function of lowering a pyrolysis temperature of the hydrocarbon-based carbon source gas by its catalytic function to drop a film formation temperature of the carbon film by the thermal CVD method.

The halogen element includes fluorine (F), chlorine (Cl), bromine (Br) and iodine (I). The halogen element-containing gas may be a halogen element alone, that is to say, a single fluorine ($F_2$) gas, a single chlorine ($Cl_2$) gas, a single bromine ($Br_2$) gas or a single iodine ($I_2$) gas, or a compound thereof. However, the halogen element alone has an advantage in that heat for pyrolysis is unnecessary and the effect of lowering the pyrolysis temperature of the hydrocarbon-based carbon source gas is high. Among the above halogen elements, fluorine having high reactivity may deteriorate surface roughness and flatness of the formed carbon film. Therefore, chlorine, bromine and iodine excluding fluorine may be used as the halogen element. In particular, chlorine is preferable from the viewpoint of handling.

The inert gas supplied from the inert gas supply source 131c is used as a purge gas or a dilution gas. An example of the inert gas may include a noble gas such as a $N_2$ gas or an Ar gas.

The seed gas supplied from the seed gas supply source 131d is to form a seed layer on the underlying layer for improving the adhesion between the underlying layer and the carbon film, prior to forming the carbon film. A boron-based thin film is used as the seed layer. Boron or boron nitride which has a stoichiometric composition or remains in a boron-rich state may be used for the boron-based thin film.

A gas containing a boron-containing gas is used as the seed gas. A borane-based gas typified by a diborane ($B_2H_6$) gas, or a boron trichloride ($BCl_3$) gas may be used as the boron-containing gas used as the seed gas. Among these, the $B_2H_6$ gas may be more suitably used. When the boron-based thin film is boron nitride, a nitride gas may be used in addition to the boron-containing gas. An ammonia ($NH_3$) gas may be suitably used as the nitriding gas. An organic amine gas and a hydrazine gas may also be used as the nitriding gas. In the case of using the nitriding gas, a separate nitriding gas supply source may be installed to supply the nitriding gas into the process chamber S from a separate gas supply port via a separate mass flow controller (MFC) and a separate opening/closing valve.

The film forming apparatus 100 includes a control part 150. The control part 150 is provided with a process controller 151 composed of a microprocessor (computer), which controls respective components of the filming apparatus 100. A user interface 152 and a storage part 153 are connected to the process controller 151.

The user interface 152 includes an input part provided with a touch panel display, a keyboard and the like for allowing an operator to input commands to manage the film forming apparatus 100, and a display part for visually displaying the operation status of the film forming apparatus 100.

The storage part 153 stores a so-called process recipe which includes a control program for realizing various processes executed in the film forming apparatus 100 under the control of the process controller 151, and a program for causing the respective components of the film forming apparatus 100 to perform processes according to process conditions. The process recipe is stored in a storage medium in the storage part 153. The storage medium may be a hard disk or a semiconductor memory, or may be a portable medium such as a CD-ROM, a DVD, a flash memory or the like. Further, the process recipe may be appropriately transmitted from another apparatus, for example, via a dedicated line.

As necessary, the process recipe is read out from the storage part 153 according to an operator's instruction or the like provided from the user interface 152, and the process controller 151 causes the film forming apparatus 100 to execute a process according to the process recipe thus read.

<Carbon Film Forming Method>

Next, one embodiment of a carbon film forming method of the present disclosure, which is performed by the film forming apparatus 100 of FIG. 1, will be described.

Figure 3A:
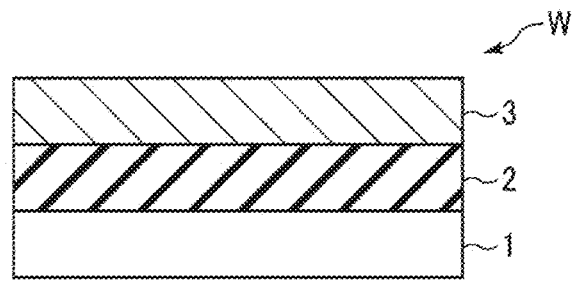
FIGS. 3A to 3C are process sectional views used to explain the carbon film forming method according to one embodiment of the present disclosure.
Figure 3B:
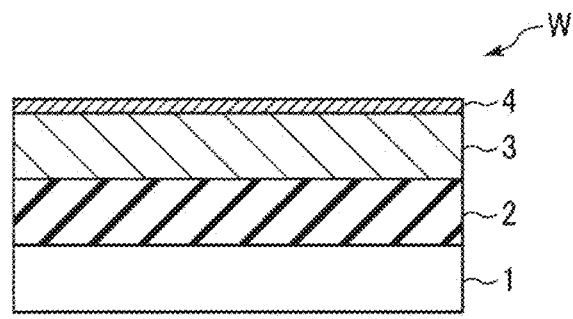
Figure 3C:
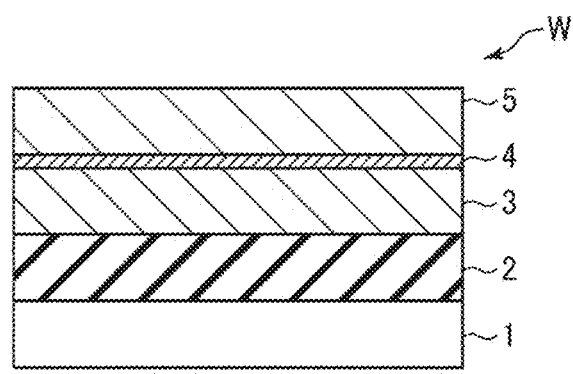

FIG. 2 is a flowchart showing a flow of the carbon film forming method according to one embodiment of the present disclosure and FIGS. 3A to 3C are process sectional views used to explain the carbon film forming method.

First, for example, as shown in FIG. 3A, a plurality of, e.g., 50 to 150, wafers W in each of which a silicon oxide film 2 is formed on a silicon base body 1 having a predetermined structure (not shown) formed thereon and an amorphous silicon film 3 is formed on the silicon oxide film 2, is mounted on the wafer boat 112. The wafer boat 112 is inserted into the process chamber S in the film forming apparatus 100 from below. In this way, the plurality of wafers W is loaded into the process chamber S (Step S1). Then, by closing the lower end opening portion of the manifold 110 with the lid part 116, the interior of the process chamber S is hermetically sealed. In this state, the interior of the process chamber S is evacuated to maintain a predetermined depressurized atmosphere, power supplied to the heating device 108 is controlled to raise the wafer temperature to a process temperature, and the wafer boat 112 is rotated.

In that state, first, a gas containing a boron-containing gas is supplied as a seed gas from the seed gas supply source 131d and is adsorbed onto a wafer surface (surface of the amorphous silicon film 3 as the underlying film) to form a seed layer 4 for improving adhesion (Step S2, FIG. 3B).

In Step S2, a borane-based gas typified by a diborane ($B_2H_6$) gas, or a boron trichloride ($BCl_3$) gas is used as the boron-containing gas supplied from the seed gas supply source 131d to form a boron-based thin film as the seed layer 4.

A boron film composed of boron alone, or a boron nitride film which has a stoichiometric composition or remains in a boron-rich state, may be suitably used as the boron-based thin film. The boron film may be formed by pyrolysis using only the boron-containing gas as the gas containing a boron-containing gas. On the other hand, the boron nitride film may be formed using a nitriding gas such as an ammonia ($NH_3$) gas, an organic amine gas, an hydrazine gas or the like, in addition to the boron-containing gas, as the gas containing a boron-containing gas. A $B_2H_6$ gas may be used as the boron-containing gas, and the $NH_3$ gas may be used as the nitriding gas.

The temperature of the wafer W as a workpiece at the time of forming the seed layer 4 in Step S2 may fall within a range of 200 to 300 degrees C. from the viewpoint of efficient film formation and good controllability.

After forming the seed layer 4 in Step S2, the interior of the process chamber S is purged and a carbon film 5 is formed by thermal CVD without using plasma assist (Step S3, FIG. 3C).

In the process of forming the carbon film by the thermal CVD in Step S3, a gas containing hydrocarbon, for example, a $C_5H_8$ gas, is supplied as a hydrocarbon-based carbon source gas from the hydrocarbon-based carbon source gas supply source 131a into the process chamber S. Further, a halogen-containing gas, for example, a $Cl_2$ gas, is supplied as a pyrolysis temperature lowering gas from the pyrolysis temperature lowering gas supply source 131b into the process chamber S. The hydrocarbon-based carbon source gas is heated to a predetermined temperature lower than the pyrolysis temperature thereof and is pyrolyzed. Thus, the carbon film 5 is formed on the surface of the wafer W by the thermal CVD.

After the formation of the carbon film 5 is completed, the process chamber S is exhausted by the exhaust device 107. For example, a $N_2$ gas is supplied as a purge gas from the inert gas supply source 131c into the process chamber S to purge the process chamber S. Thereafter, the internal pressure of the process chamber S is returned to atmospheric pressure, and subsequently, the wafer boat 112 is moved down to unload the wafers W.

In the present embodiment, by using the pyrolysis temperature lowering gas at the time of forming the carbon film, the pyrolysis temperature of the hydrocarbon-based carbon source gas is lowered by the catalytic effect thereof, and the carbon film is formed at a temperature lower than the pyrolysis temperature of the carbon source gas. That is to say, a temperature of 650 degrees C. or more (800 to 1,000 degrees C., specifically 650 to 800 degrees C. in the optimal conditions, which are described in the section BACKGROUND of the present disclosure), which was conventionally necessary for forming a carbon film in the thermal CVD method using a hydrocarbon-based carbon source gas, can be lowered to a lower temperature. Thus, the carbon film can be formed at a low temperature of about 300 degrees C.

By the way, the conventional technique described in the section BACKGROUND of the present disclosure shows the effects of decomposing a hydrocarbon-based carbon source gas ($C_xH_y$), for example, an ethylene gas ($C_2H_4$), by drawing hydrogen (H) out of the hydrocarbon-based carbon source gas ($C_xH_y$) through the use of a $Cl_2$ gas as a gas containing a halogen element constituting a pyrolysis temperature lowering gas. That is to say, at the time of forming a carbon film, a halogen element such as chlorine (Cl) draws H on the surface layer and is discharged as, for example, HCl. For this reason, dangling bonds are generated by desorption of H, which contributes to film formation. This technique also describes that the adhesion between the underlying film and the carbon film is increased by adsorbing an aminosilane-based gas as a seed layer between the underlying film and the carbon film.

However, in the case of using a silicon film as the underlying film, even when the aminosilane-based gas is adsorbed as the seed layer, it has proved that the adhesion may deteriorate to such an extent that film peeling is caused even at the thin film thickness of about 10 nm.

Figure 4A:
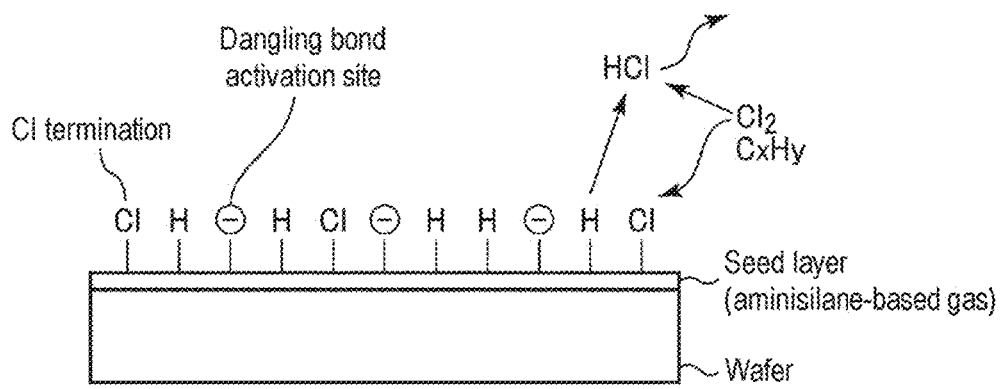
FIGS. 4A and 4B are views used to explain a comparison between a reaction model in which an aminosilane-based seed layer is used as a seed layer and a reaction model in which a boron-based thin film is used as a seed layer.

That is to say, when the $Cl_2$ gas is used as the pyrolysis temperature lowering gas, since Cl has high reactivity, depending on a material of the underlying film, even when an aminosilane-based seed layer exists, Cl is likely to terminate the dangling bonds, as shown in FIG. 4A. As such, the number of dangling bond activation sites as adsorption sites of carbon is reduced to inhibit the adsorption of C, which results in deterioration of adhesion even at a thin film thickness of about 10 nm.

Figure 4B:
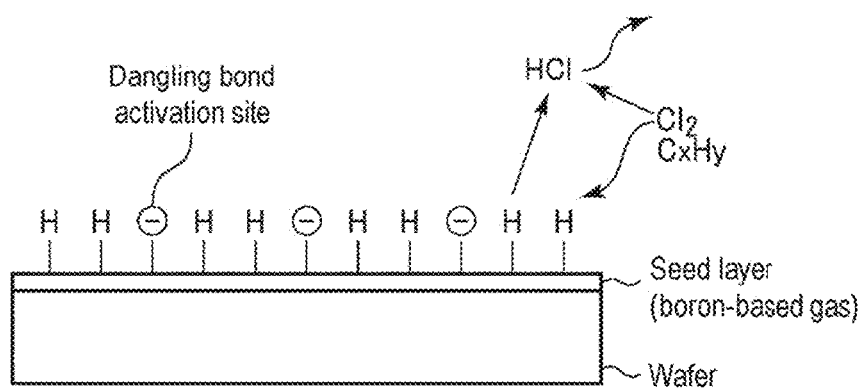

In contrast, in the present embodiment, since the boron-based thin film is used as the seed layer 4, deterioration of adhesion hardly occurs due to a difference in reactivity between the boron-based thin film and the underlying silicon film. That is to say, by using the boron-based thin film as the seed layer 4, the reactivity with Cl is suppressed, which makes it hard for Cl to terminate the dangling bonds, as shown in FIG. 4B. Therefore, the dangling bond activation sites as carbon adsorption sites are hardly decreased, thereby preventing deterioration of adhesion of the carbon film due to adsorption inhibition. Therefore, it is possible to form a carbon film having good adhesion irrespective of the underlying film. In addition, damage due to Cl can be suppressed by the seed layer composed of a boron-based thin film. From the viewpoint of obtaining such effects, a thickness of the boron-based thin film constituting the seed layer 4 may fall within a range of 0.5 to 3.0 nm.

Process conditions used in Steps S2 and S3 are as follows:

<Step S2>
Film formation temperature: 200 to 300 degrees C.
Internal pressure of the process chamber: 0.1 to 5.0 Torr (13.3 to 666.7 Pa)
Gas Flow Rate:
For boron film,
Flow rate of $B_2H_6$ gas: 100 to 1,000 sccm (mL/min)
For boron nitride film,
Flow rate of $B_2H_6$ gas: 100 to 1,000 sccm (mL/min)
Flow rate of $NH_3$ gas: 100 to 1,000 sccm (mL/min)
<Step S3>
Film formation temperature: 300 to 600 degrees C. (more specifically, 350 to 400 degrees C.)
Internal pressure of the process chamber: 1 to 100 Torr (133 to 13,300 Pa)
Flow rate of Hydrocarbon-based carbon source gas: 100 to 2,000 sccm (mL/min)
Flow rate of Pyrolysis temperature lowering gas: 20 to 200 sccm (mL/min)
Flow rate ratio of Hydrocarbon-based carbon source gas and Pyrolysis temperate lowering gas (partial pressure ratio): 2 to 100
Film thickness of carbon film: 2.0 to 500 nm In addition, examples of actual manufacturing conditions are as follows:

<Step S2>
Boron-containing gas: $B_2H_6$
Nitriding gas: $NH_3$
Gas flow rate ratio: $B_2H_6/NH_3$=700/100 sccm
Film formation temperature: 300 degrees C.
Internal pressure of the process chamber: 0.5 Torr (66.5 Pa)
Thickness of seed layer: 1.0 nm
<Step S3>
Hydrocarbon-based carbon source gas: butadiene ($C_4H_6$)
Pyrolysis temperature lowering gas: $Cl_2$
Gas flow rate ratio: $C_4H_6/Cl_2$=100/50 sccm
Film formation temperature: 350 degrees C.
Internal pressure of the process chamber: 1.51 Torr (200 Pa)
Film thickness of carbon film: 100 nm Although in the example of FIGS. 3A to 3C, there has been described the case where the wafer as a workpiece including the silicon base body, the silicon oxide film formed on the silicon base body, and the amorphous silicon film formed on the silicon oxide film, the structure of the workpiece is not limited thereto.

Experimental Example

An experimental example will be described below.

In this experimental example, for Samples A to D, a tape test has been conducted to check the adhesion of a carbon film. Sample A to D were obtained by forming a thermal oxide film (Th-Ox), an amorphous silicon film (a-Si), a boron silicon film (BSiLT) and a SiN film (SiN) as underlying films on bare silicon wafers, respectively; forming a boron nitride film as a seed layer on each of the underlying films thus formed; and forming amorphous carbons film using butadiene ($C_4H_6$) as a hydrocarbon-based carbon source gas and a $Cl_2$ gas as a pyrolysis temperature lowering gas, respectively. For comparison, with respect to Samples E and F, the tape test has been conducted to check the adhesion of a carbon film. Sample E was obtained by forming a seed layer on a bare silicon wafer directly using an aminosilane-based gas and subsequently; forming an amorphous carbon film on the seed layer as in the above. Sample F was obtained by forming a $SiO_2$ film as an underlying film, forming a seed layer on the $SiO_2$ film using an aminosilane-based gas, and subsequently; forming an amorphous carbon film on the seed layer as in the above.

The film formation conditions for the amorphous carbon film are as follows for all samples.
  Flow rate of $C_4H_6$ gas: 100 sccm
  Flow rate of $Cl_2$ gas: 50 sccm
  Film formation temperature: 350 degrees C.
  Internal pressure of the process chamber: 1.5 Torr (200 Pa)
  Film thickness: 50 nm The film formation conditions for the boron nitride film as the seed layer in Samples A to D are as follows.
  Flow rate of $B_2H_6$ gas: 700 sccm
  Flow rate of $NH_3$ gas: 100 sccm
  Film formation temperature: 300 degrees C.
  Internal pressure of the process chamber: 0.5 Torr (66.5 Pa)
  Time: 2.5 min
  Thickness of seed layer: less than 1 nm The formation conditions of the seed layer using the aminosilane-based gas in Samples E and F are as follows.
  Aminosilane-based gas: BTBAS (bis-tertiary-butylaminosilane)
  Flow rate: 100 sccm
  Process temperature: 400 degrees C.
  Internal pressure of the process chamber: 0.1 Torr (13 Pa)
  Process time: 5 min The tape test was conducted under the conditions of JIS K 5600-5-6 (cross-cut method) and was evaluated based on the presence or absence of film peeling.

In Sample E, the silicon wafer was damaged by an etching reaction and was subjected to no tape test. Sample F received a not good (NG) decision in the tape test.

In contrast, as shown in FIG. 5, all Samples A to D received an OK decision in the tape test and were confirmed from the SEM photograph that the adhesion of the carbon film was good and no damage to Si occurred.

<Other Applications>

Although the embodiment of the present disclosure has been described above, the present disclosure is not limited to the above embodiment, but various modifications may be made without departing from the spirit and scope of the present disclosure.

For example, in the above embodiment, an example in which a carbon film is formed using a vertical batch type film forming apparatus has been described, but a single wafer type film forming apparatus may be used. Another batch type film forming apparatus other than the vertical batch type film forming apparatus may be used.

In addition, although a workpiece has been illustrated with a semiconductor wafer in the above embodiment, the present disclosure is not limited to the semiconductor wafer. The present disclosure may be applied to another workpiece such as a glass substrate used for an FPD (Flat Panel Display) such as a liquid crystal display device, a ceramic substrate or the like According to the present disclosure in some embodiments, by forming a seed layer composed of a boron-based thin film on an underlying film prior to forming a carbon film using a hydrocarbon-based carbon source gas and a pyrolysis temperature lowering gas containing a halogen element, it is possible to suppress a reaction between the halogen element and the underlying film, thus forming the carbon film having high adhesion.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a carbon film on a workpiece, comprising:
  loading the workpiece on which a silicon film is formed into a process chamber;
  supplying a gas containing a boron-containing gas into the process chamber to form a seed layer composed of a boron-based thin film on a surface of the workpiece; and
  subsequently, supplying a hydrocarbon-based carbon source gas and a pyrolysis temperature lowering gas containing a halogen element which lowers a pyrolysis temperature of the hydrocarbon-based carbon source gas into the process chamber, heating the hydrocarbon-based carbon source gas to a temperature lower than the pyrolysis temperature to pyrolyze the hydrocarbon-based carbon source gas, and forming the carbon film on the workpiece by a thermal CVD,
  wherein a film formation temperature at the time of forming the seed layer composed of the boron-based thin film is 200 to 300 degrees C.,
  wherein the seed layer composed of the boron-based thin film has a thickness of 0.5 to 3.0 nm such that the seed layer composed of the boron-based thin film is capable of suppressing a reactivity of the pyrolysis temperature lowering gas, and
  wherein the boron-based thin film is a boron film.

2. The method of claim 1, wherein at least one of a borane-based gas and a boron trichloride gas is used as the gas containing a boron-containing gas.

3. The method of claim 1, wherein a film formation temperature at the time of forming the carbon film is 300 to 600 degrees C.

4. The method of claim 1, wherein the pyrolysis temperature lowering gas is a $Cl_2$ gas.

5. The method of claim 1, wherein the hydrocarbon-based carbon source gas is a gas containing hydrocarbon represented by at least one of molecular formulae of $C_nH_{2n+2}$, $C_mH_{2m}$ and $C_mH_{2m-2}$ (where, n is the natural number of one or more and m is the natural number of two or more).

6. An apparatus of forming a carbon film on a workpiece, comprising:
- a process chamber in which the workpiece on which the carbon film is to be formed is accommodated;
- a process gas supply mechanism configured to supply a gas to be used for process into the process chamber;
- a heating device configured to heat the workpiece accommodated in the process chamber;
- a loading mechanism configured to load the workpiece into the process chamber, and a control part configured to control the process gas supply mechanism, the heating device and the loading mechanism to perform the method of claim 1.

7. A non-transitory computer-readable storage medium storing a program that operates on a computer for controlling a carbon film forming apparatus, wherein the program, when executed, causes the computer to control the carbon film forming apparatus so as to perform the method of claim 1.

* * * * *